(12) United States Patent
Cheng et al.

(10) Patent No.: US 11,320,487 B1
(45) Date of Patent: May 3, 2022

(54) PROGRAMMABLE TEST COMPACTOR FOR IMPROVING DEFECT DETERMINATION

(71) Applicant: Siemens Industry Software Inc., Plano, TX (US)

(72) Inventors: Wu-Tung Cheng, Lake Oswego, OR (US); Chen Wang, Lake Oswego, OR (US); Mark A. Kassab, Wilsonville, OR (US)

(73) Assignee: SIEMENS INDUSTRY SOFTWARE INC., Plano, TX (US)

( * ) Notice: Subject to any disclaimer, the term of this patent is extended or adjusted under 35 U.S.C. 154(b) by 0 days.

(21) Appl. No.: 17/330,515

(22) Filed: May 26, 2021

(51) Int. Cl.
*G01R 31/3185* (2006.01)
*G01R 31/317* (2006.01)
*G01R 31/3183* (2006.01)
*G01R 31/3181* (2006.01)

(52) U.S. Cl.
CPC ........... *G01R 31/318536* (2013.01); *G01R 31/31725* (2013.01); *G01R 31/31813* (2013.01); *G01R 31/318335* (2013.01); *G01R 31/318555* (2013.01)

(58) Field of Classification Search
CPC ...... G01R 31/318536; G01R 31/31725; G01R 31/31813; G01R 31/318335; G01R 31/318555
USPC ............ 714/726, 729, 731, 732, 735
See application file for complete search history.

(56) References Cited

U.S. PATENT DOCUMENTS

| | | | | |
|---|---|---|---|---|
| 6,557,129 | B1 * | 4/2003 | Rajski | G01R 31/318547 714/729 |
| 7,376,873 | B2 * | 5/2008 | Vranken | G01R 31/31719 714/30 |
| 7,925,465 | B2 * | 4/2011 | Lin | G01R 31/318575 702/124 |
| 7,925,947 | B1 * | 4/2011 | Touba | G01R 31/318547 714/732 |
| 8,468,404 | B1 * | 6/2013 | Chickermane | G01R 31/318575 714/729 |
| 8,904,256 | B1 * | 12/2014 | Chakravadhanula | G01R 31/318547 714/731 |
| 10,996,273 | B2 * | 5/2021 | Milewski | G01R 31/318342 |
| 11,073,556 | B2 * | 7/2021 | Cheng | G01R 31/318563 |
| 2007/0067688 | A1 * | 3/2007 | Vranken | G01R 31/318566 714/733 |

(Continued)

OTHER PUBLICATIONS

Rajski et al., X-Press: Two-Stage X-Tolerant Compactor With Programmable Selector, Jan. 2008, IEEE, vol. 27, No. 1, pp. 147-159. (Year: 2008).*

(Continued)

*Primary Examiner* — John J Tabone, Jr.

(57) ABSTRACT

A circuit comprises: scan chains comprising scan cells, the scan chains configured to shift in test patterns, apply the test patterns to the circuit, capture test responses of the circuit, and shift out the test responses; a decompressor configured to decompress compressed test patterns into the test patterns; a test response compactor configured to compact the test responses; and shuffler circuitry inserted between outputs of the scan chains and inputs of the test response compactor, the shuffler circuitry comprising state elements configured to delay output signals from some of the scan chains for one or more clock cycles based on a control signal, the control signal varying with the test patterns.

20 Claims, 10 Drawing Sheets

(56) References Cited

U.S. PATENT DOCUMENTS

| | | | |
|---|---|---|---|
| 2008/0195346 A1* | 8/2008 | Lin | G01R 31/318575 |
| | | | 702/119 |
| 2013/0166977 A1* | 6/2013 | Pugliesi-Conti | H04L 9/002 |
| | | | 714/727 |
| 2014/0149812 A1* | 5/2014 | Tekumalla | G01R 31/31705 |
| | | | 714/727 |
| 2014/0317463 A1* | 10/2014 | Chandra | G01R 31/31723 |
| | | | 714/729 |
| 2014/0372818 A1* | 12/2014 | Rajski | G01R 31/318547 |
| | | | 714/726 |
| 2016/0003907 A1* | 1/2016 | Rasjki | G01R 31/318385 |
| | | | 714/738 |
| 2019/0293718 A1* | 9/2019 | Milewski | G01R 31/318342 |
| 2020/0341057 A1* | 10/2020 | Cheng | G01R 31/31724 |
| 2021/0018563 A1* | 1/2021 | Rajski | G01R 31/318555 |

OTHER PUBLICATIONS

Rajski et al., Embedded Deterministic Test for Low-Cost Manufacturing, 2003, IEEE, pp. 58-66. (Year: 2003).*
S. Mitra and K. S. Kim, "X-Compact: an efficient response compaction technique", IEEE Transactions on computer aided design of Integrated Circuits and Systems, vol. 23, No. 3, pp. 421-432, Mar. 2004.
Grzegorz Mrugalski et al., "Fault Diagnosis With Convolutional Compactors," IEEE Transactions on computer aided design of Integrated Circuits and Systems, vol. 26, No. 8, pp. 1478-1494, Aug. 2007.

* cited by examiner

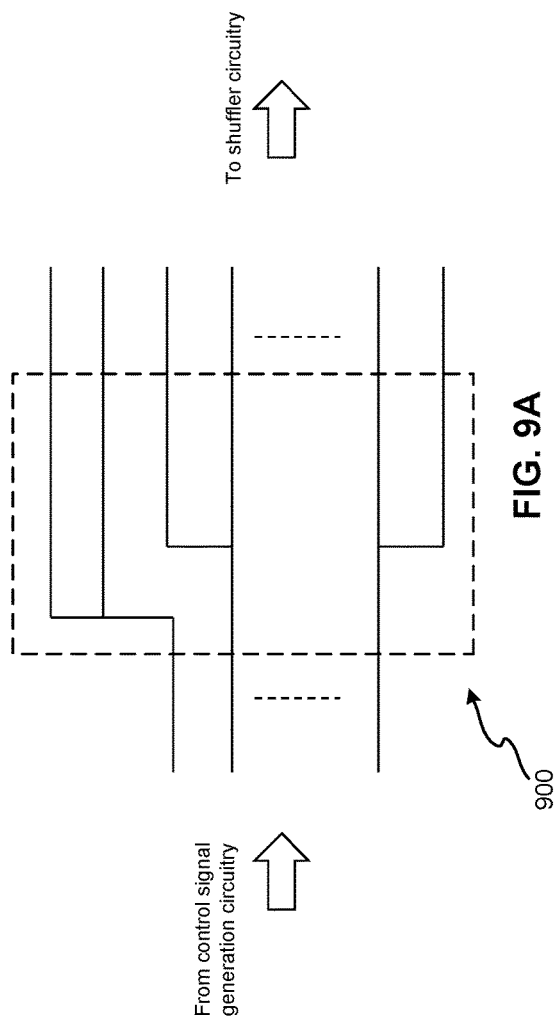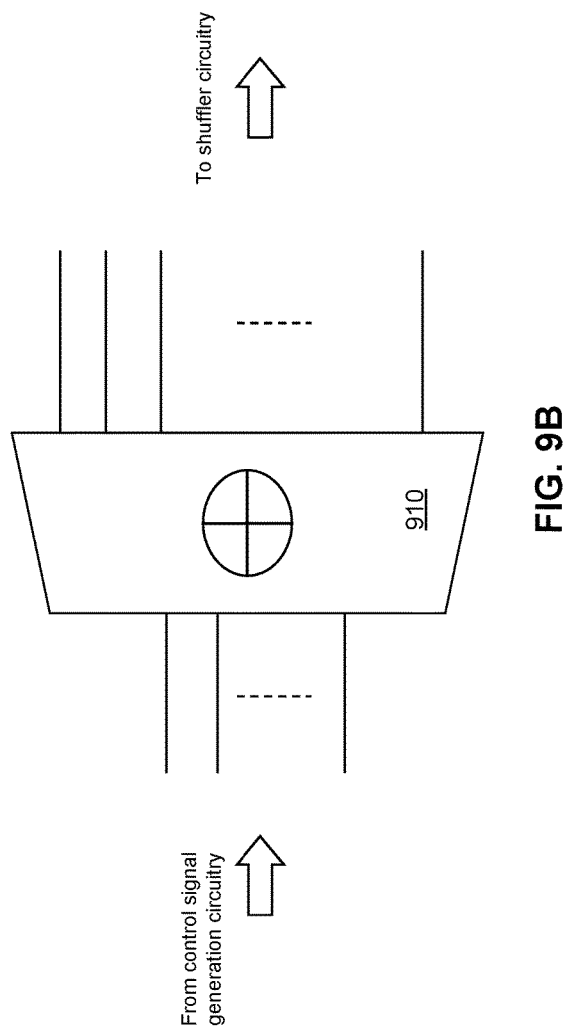

PROGRAMMABLE TEST COMPACTOR FOR IMPROVING DEFECT DETERMINATION

FIELD OF THE DISCLOSED TECHNIQUES

The presently disclosed techniques relates to circuit testing. Various implementations of the disclosed techniques may be particularly useful for increasing fault diagnosis resolution.

BACKGROUND OF THE DISCLOSED TECHNIQUES

Test data compression is widely recognized as instrumental in reducing the overall cost of scan-based semiconductor device testing. With aggressive technology scaling, test response compaction, working synergistically with test stimuli compression, plays a key role in handling test data volume growth. Development of compaction schemes reflects ever-changing needs of many applications and addresses insatiable consumer demands for greater performance at a lower cost.

While reducing test response data volume, test response compaction can make some faults indistinguishable for diagnosis. As such, diagnosis reports can have more suspects with higher compression. More suspects can lead to more work for failure analysis to verify each suspect to identify defects. With new designs based on advanced manufacturing technologies, higher compression and more expensive failure analysis, it is important to reduce the number of suspects in diagnosis reports.

BRIEF SUMMARY OF THE DISCLOSED TECHNIQUES

Various aspects of the disclosed technology relate to test response bit shuffling for improving diagnosis resolution. In one aspect, there is a circuit, comprising: scan chains comprising scan cells, the scan chains configured to shift in test patterns, apply the test patterns to the circuit, capture test responses of the circuit, and shift out the test responses; a decompressor configured to decompress compressed test patterns into the test patterns; a test response compactor configured to compact the test responses; and shuffler circuitry inserted between outputs of the scan chains and inputs of the test response compactor, the shuffler circuitry comprising state elements configured to delay output signals from some of the scan chains for one or more clock cycles based on a control signal, the control signal varying with the test patterns.

The circuit may further comprise: control signal generation circuitry configured to generate the control signal or a source signal which can be multiplexed to form the control signal. The control signal or the source signal may comprise bits outputted from some or all of the scan chains at a particular clock cycle, bits outputted from some or all of output channels of the decompressor at a particular clock cycle, or bits outputted from one of output channels of the decompressor or an input port of the circuit for a plurality of clock cycles. The circuit may still further comprise: control signal multiplexing circuitry configured to multiplex the source signal to form the control signal.

The circuit may further comprise: masking circuitry inserted either between the outputs of the scan chains and inputs of the shuffler circuitry or outputs of the shuffler circuitry and the inputs of the test response compactor, the masking circuitry configured to block output signals from one or more of the scan chains from reaching the inputs of the compactor based on a masking control signal.

The control signal may be derived from first bits of a test response outputted from some or all of the scan chains.

The test response compactor may comprise an XOR gate network or an inverter network.

The shuffler circuitry may comprise a plurality of shuffler devices, each of the plurality of shuffler devices being associated with one of the scan chains, comprising one or more pairs of a state element and a multiplexer, and being controlled by one or more bits of the control signal.

In another aspect, there are one or more non-transitory computer-readable media storing computer-executable instructions for causing one or more processors to perform a method, the method comprising: creating a circuit in a circuit design for testing a chip fabricated according to the circuit design, the circuit comprising: scan chains comprising scan cells, the scan chains configured to shift in test patterns, apply the test patterns to the circuit, capture test responses of the circuit, and shift out the test responses; a decompressor configured to decompress compressed test patterns into the test patterns; a test response compactor configured to compact the test responses; and shuffler circuitry inserted between outputs of the scan chains and inputs of the test response compactor, the shuffler circuitry comprising state elements configured to delay output signals from some of the scan chains for one or more clock cycles based on a control signal, the control signal varying with the test patterns.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 9A illustrates an example of control signal multiplexing circuitry according to various embodiments of the disclosed technology.

FIG. 9B illustrates another example of control signal multiplexing circuitry according to various embodiments of the disclosed technology.

DETAILED DESCRIPTION OF THE DISCLOSED TECHNIQUES

General Considerations

Various aspects of the disclosed technology relate to test response bit shuffling for improving diagnosis resolution. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

The detailed description of a method or a device sometimes uses terms like "compact," "delay," and "shuffling" to describe the disclosed method or the device function/structure. Such terms are high-level descriptions. The actual operations or functions/structures that correspond to these terms will vary depending on the particular implementation and are readily discernible by one of ordinary skill in the art.

Additionally, as used herein, the term "design" is intended to encompass data describing an entire integrated circuit device. This term also is intended to encompass a smaller group of data describing one or more components of an entire device such as a portion of an integrated circuit device nevertheless.

Illustrative Operating Environment

Figure 1:
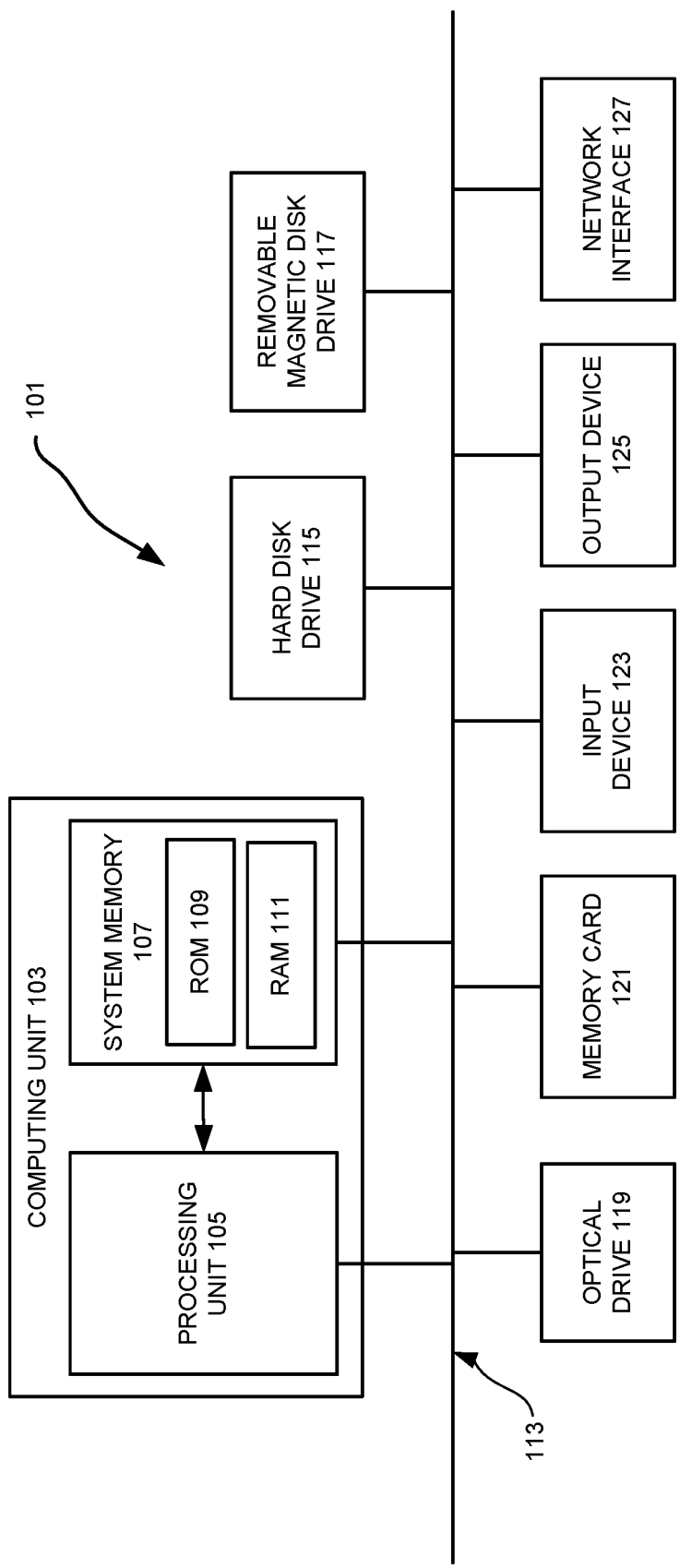
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but it will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it is not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multi-processor computer, a plurality of single and/or multiprocessor computers arranged into a network, or some combination of both.

Design for Test, Test Pattern Generation, and Testing

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell includes an edge-triggered flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting (activating) a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is a flaw or physical imperfection caused in a device during the manufacturing process. A fault model (or briefly a fault) is a description of how a defect alters design behavior. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period. Cell internal fault models can be derived using transistor-level circuit simulations (analog simulations). This approach can pinpoint the defect location within a cell for various cell internal defects.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis (also referred to as scan diagnosis) is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Diagnosis includes logic diagnosis (sometimes referred to as scan diagnosis or diagnosis) and chain diagnosis. Logic diagnosis may employ a fault dictionary or directly examine the syndrome (i.e., the effect) of the failing chip to determine likely defect locations (defect suspects). The latter approach may include structural pruning (backtracing), fault injection and evaluation (fault simulation for both failing and passing test patterns). The quality of diagnosis can be measured by diagnostic resolution (the number of the real defects vs. the number of the defect suspects). Diagnostic resolution is linked not only to the algorithm used for diagnosis but also to the test patterns used for the manufacturing test (manufacturing test patterns). To enhance the diagnosis quality, a diagnostic test pattern generation process may be employed. This process generates test patterns that can refine the set of defect suspects.

Chain diagnosis determines scan cells that are likely to be defective. Scan elements and related clocking circuitry can take up about 30% of silicon area of an IC chip. It has been reported that scan chain failures account for almost 50% of chip failure in some cases. Chain diagnosis is thus important to guide physical failure analysis and yield learning process. In a chain diagnosis process, two types of test patterns may be used. The first type is called chain patterns. A chain pattern is a pattern used in a process comprising shift-in and shift-out without pulsing capture clocks. The other type is often referred to as scan patterns. A scan pattern is a pattern used in a process comprising shift-in, one or multiple capture clock cycles, and shift-out, and the scan patterns include patterns generated by ATPG for testing system logic, special chain diagnostic patterns generated only for scan chain diagnosis purpose and some special functional patterns. Chain patterns can be used to test the integrity of scan chains and/or determine fault models associated with faulty scan chains while scan patterns can be used to inject certain values to some scan cells for locating defective scan cells. Some techniques for chain diagnosis are disclosed in U.S. Pat. Nos. 7,788,561; 8,615,695; 8,316,265; 8,689,070; 8,843,796; and 9,086,459, of which all are hereby incorporated herein by reference.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can not only reduce the amount of data stored on the tester but also reduce the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (logic BIST) is a DFT technique that permits a circuit to test itself using embedded test logic without the need of an external tester. Classical logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-random pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

All of the above mentioned processes, design insertion for testing, test pattern generation, and logic diagnosis, are normally performed by various electronic design automation tools such as those in the Tessent family of software tools available from Mentor Graphics Corporation, Wilsonville, Oreg.

Shuffling Before Compaction to Improve Diagnosis Resolution

Figure 2:
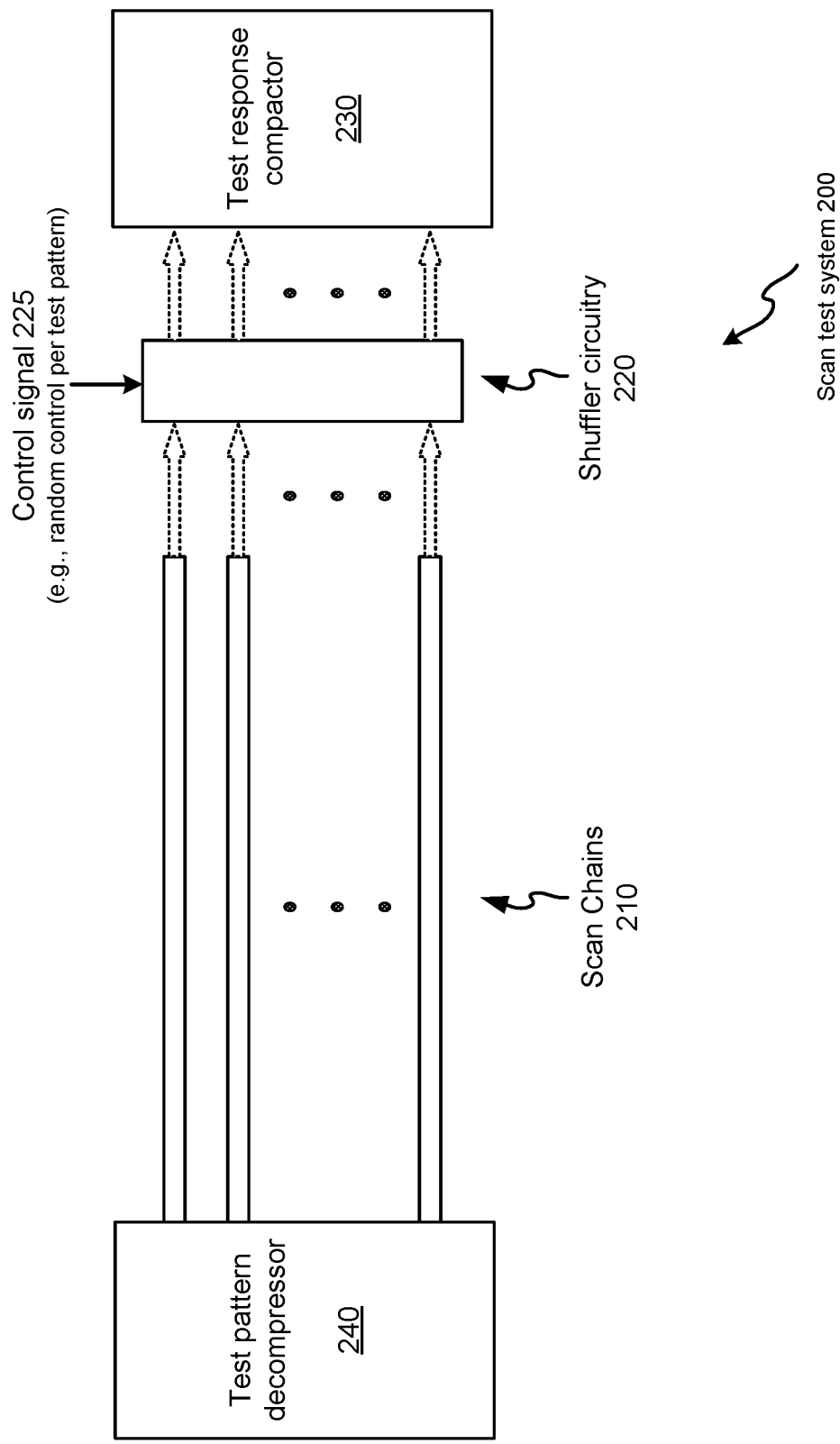
FIG. 2 illustrates an example of a scan test system according to various embodiments of the disclosed technology.

FIG. 2 illustrates an example of a scan test system 200 according to various embodiments of the disclosed technology. The scan test system 200 comprises scan chains 210, a test pattern decompressor 240, a test response compactor 230, and shuffler circuitry 220. The scan chains 210, comprising scan cells, are configured in a test mode to shift in test patterns, apply the test patterns to the circuit, capture test responses of the circuit, and shift out the test responses. The test pattern decompressor 240 is configured to decompress compressed test patterns into the test patterns. In a typical EDT compression architecture, the test pattern decompressor 240 comprises a ring generator and a phase shifter. The test response compactor 230 is configured to compact the test responses, which can be a time compactor such as a multiple-input signature register (MISR), a combinational compactor such as an XOR gate network, or a combination of the two. The shuffler circuitry 220, comprising state elements, is configured to delay output signals from some of the scan chains for one or more clock cycles based on a control signal 225. The state elements can be flip-flops or latches. The control signal 225 can vary with the test patterns. For example, the control signal 225 can vary in a "random" way test pattern by test pattern. In one example, for each test pattern, the shuffler circuitry 220 "randomly" selects, based on the control signal 225, a group of scan chains, from which outputs are delayed by one clock cycle. Outputs from the rest of the scan chains 210 pass through without delay. The group of scan chains selected for one test pattern can be different from the group selected for another test pattern. In another example, for each test pattern, the shuffler circuitry 220 "randomly" selects, based on the control signal 225, a first group of scan chains, from which outputs are delayed by one clock cycle, a second group of scan chains, from which outputs are delayed by two clock cycles, and a third group of scan chains, from which outputs are delayed by three clock cycles. Outputs from the rest of the scan chains 210 pass through without delay.

Masking circuitry may be inserted either between the outputs of the scan chains 210 and inputs of the shuffler circuitry 220 or between outputs of the shuffler circuitry 220 and the inputs of the test response compactor 230. The masking circuitry can be configured to block output signals from one or more of the scan chains from reaching the inputs of the compactor based on a second control signal. Test response compaction is vulnerable to unknown (X) states, which can render test useless. X values occur in complex designs due to uninitialized memory elements, non-scan flip-flops, bus contentions, floating buses, unwrapped analog modules, internal three-state logic, cross clock domain signals, timing exceptions, or multi-cycle and false paths when generating at-speed tests. These states, once captured in scan cells, may subsequently be injected into a test response compactor, where they can severely affect test results. In particular, X states can quickly proliferate due to a feedback deployed by time compactors, such as multiple-input signature registers (MISR). The masking circuitry can mask X states. Such an operation is sometimes referred to as X-masking. This masking capability may be employed to distinguish different defect behavior such that number of suspects in a diagnosis report can be reduced. However, the masking technique will have a negative impact on the compression ratio.

Another way to reduce the number of suspects is to use a compactor with a high hamming distance. The higher the Hamming distance, the better the information that can be used for distinguishing defects. However, a higher Hamming distance also means fewer codes to use for compression, resulting in smaller compression ratios. Additionally, such high-Hamming-distance compactors may perform worse in the presence of many unknown values, and may not be applicable in the presence of very few output channels.

Figure 3:
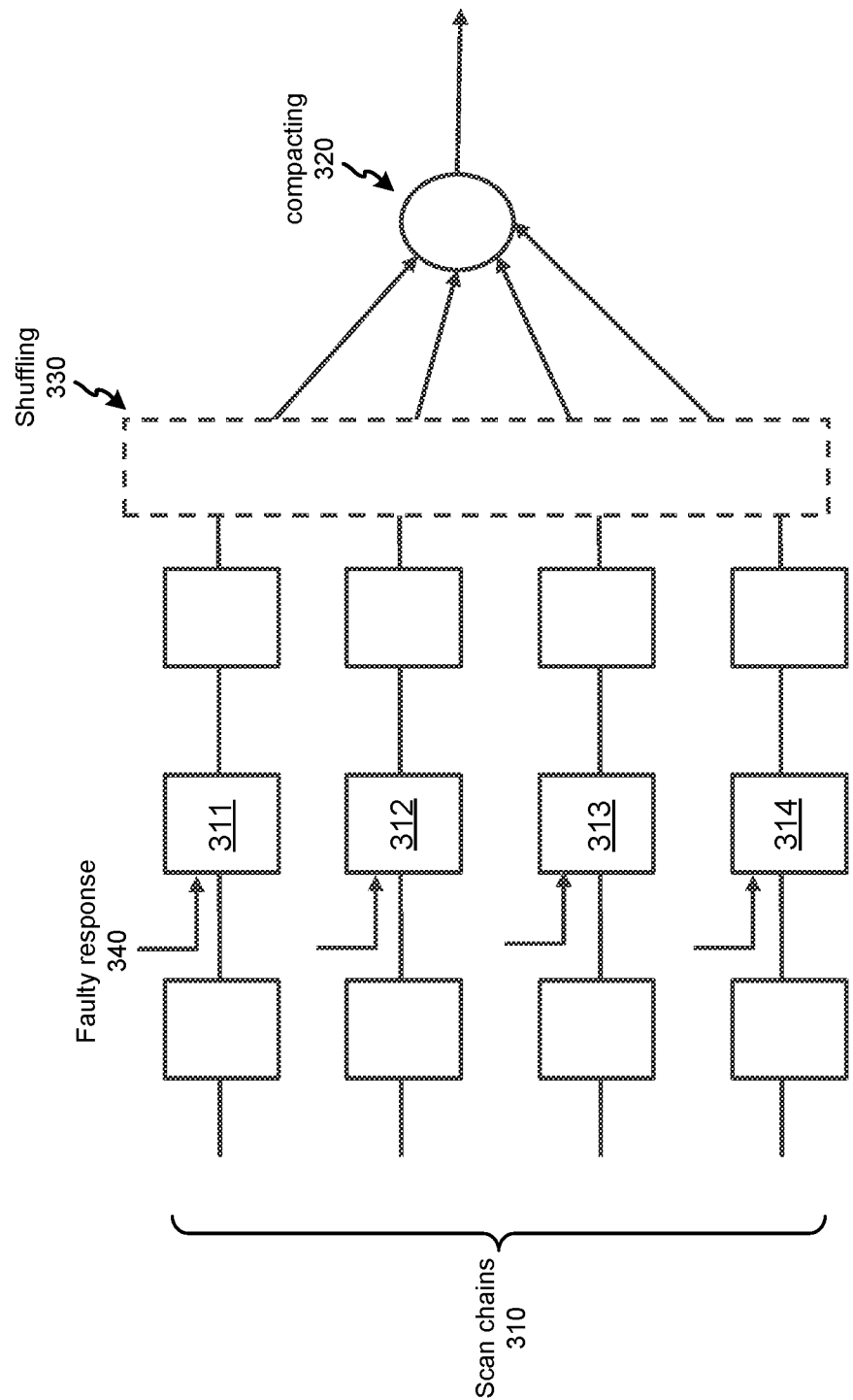
FIG. 3 illustrates an example of fault equivalency caused by compaction.

As discussed previously, compaction can cause fault equivalency and thus lead to more suspects than without compaction. FIG. 3 illustrates an example of fault equivalency caused by compaction. In the figure, the outputs of four scan chains 310 are coupled to an input of a compacting device 320. The compacting device 320 may comprise one or more XOR gates. At each shift clock cycle, four scan cell values are compacted into one bit at the output of the compacting device 320. Assume that a scan cell 311 can capture a faulty response 340. Due to the compaction, a diagnosis process may not be able to determine which of the scan cells 311, 312, 313 and 314 captures the faulty response and thus may report more suspects than without the compacting device 320.

To solve the problem, a shuffler device 330 can be inserted between the scan chains 310 and the compacting device 320. The shuffler device 330 is configured to add pipeline stages to the outputs of some of the scan chains 310 which vary with test patterns. Scan diagnosis is often performed test pattern by test pattern. At the end of a scan diagnosis process, a minimum covering algorithm is usually used to identify the most likely suspect from all suspects identified for all test patterns. Using the shuffler device 330 to shuffle output positions of scan cell values for different test patterns can result in different compaction relationship between internal scan cell values and external channel output values. As such, the fault equivalence effect caused by compaction can be reduced. In the example shown in FIG. 3, the diagnosis process can, due to the shuffling, determine that the scan cell 311 or at least a subgroup of the scan cells 311-314 including the scan cell 311 capture the faulty effect. The resolution improvement can be even higher than using a high-Hamming-distance compactor if there are many failing patterns to be used for diagnosis. Also, the shuffling does not reduce the observability of scan cell values and thus it does not reduce the compression ratio.

Figure 4:
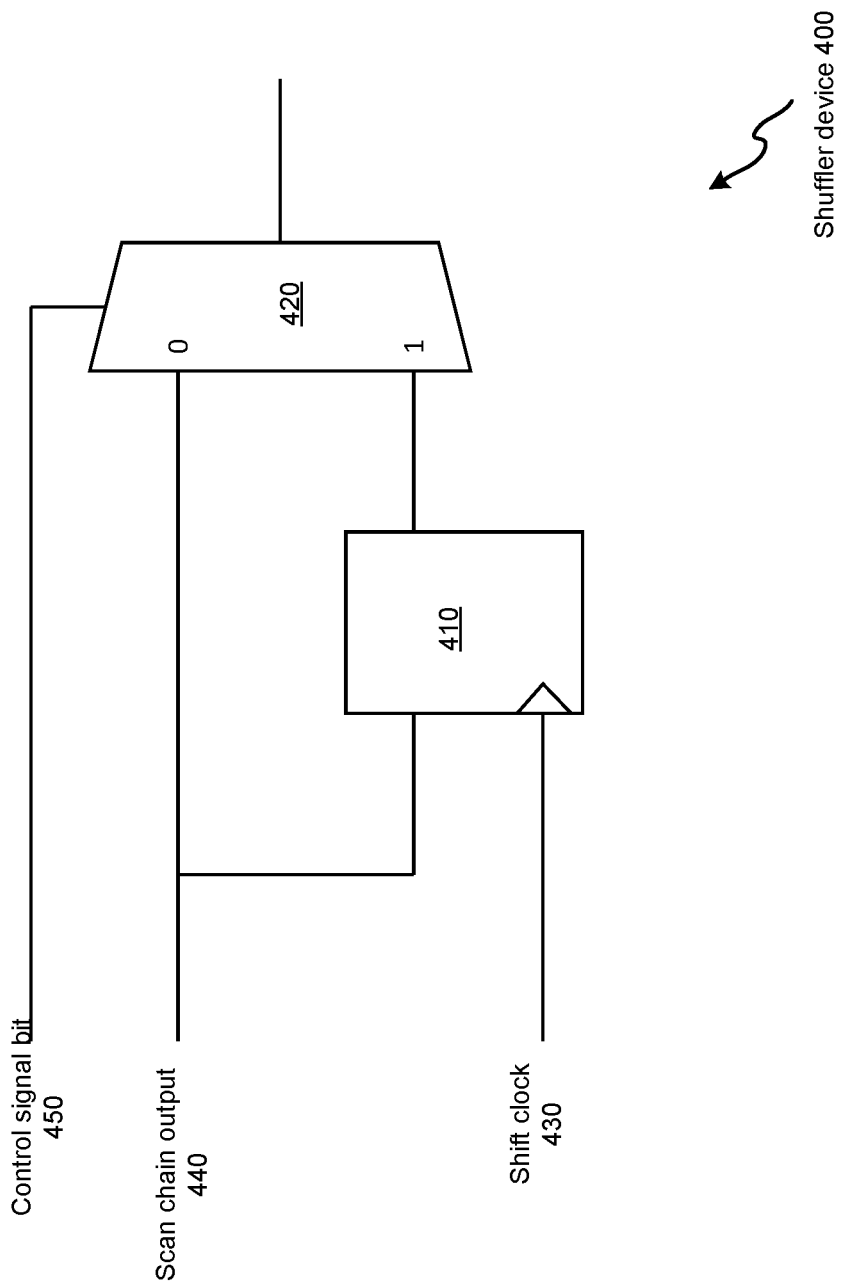
FIG. 4 illustrates an example of a shuffler device that can be used to construct the shuffler circuitry 220 shown in FIG. 2 according to various embodiments of the disclosed technology.

FIG. 4 illustrates an example of a shuffler device 400 that can be used to construct the shuffler circuitry 220 shown in FIG. 2 according to various embodiments of the disclosed technology. The shuffler device 400 comprises a flip-flop 410 and a multiplexer 420. A scan chain output 440 is coupled to both the input of the flip-flop 410 and one of the two inputs of the multiplexer 420. The other input of the multiplexer 420 is coupled to the output of the flip-flop 410. The flip-flop 410 is clocked by a shift clock 430 which also clocks, during a shift operation, the scan chains which are not shown here. A control signal bit 450 determines which input signal of the multiplexer 420 is allowed to pass through. If the control signal bit 450 is at the logic value "0", the scan chain output 440 can arrive the output of the multiplexer 420 without delay. If the control signal bit 450 is at the logic value "1", the scan chain output 440 is delayed by one clock cycle of the shift clock 430 by the flip-flop 410 before reaching the output of the multiplexer 420. With various implementations of the disclosed technology, each of all or some of the scan chains can be coupled to a shuffler device like the shuffler device 400 to increase diagnosis resolution.

Figure 5:
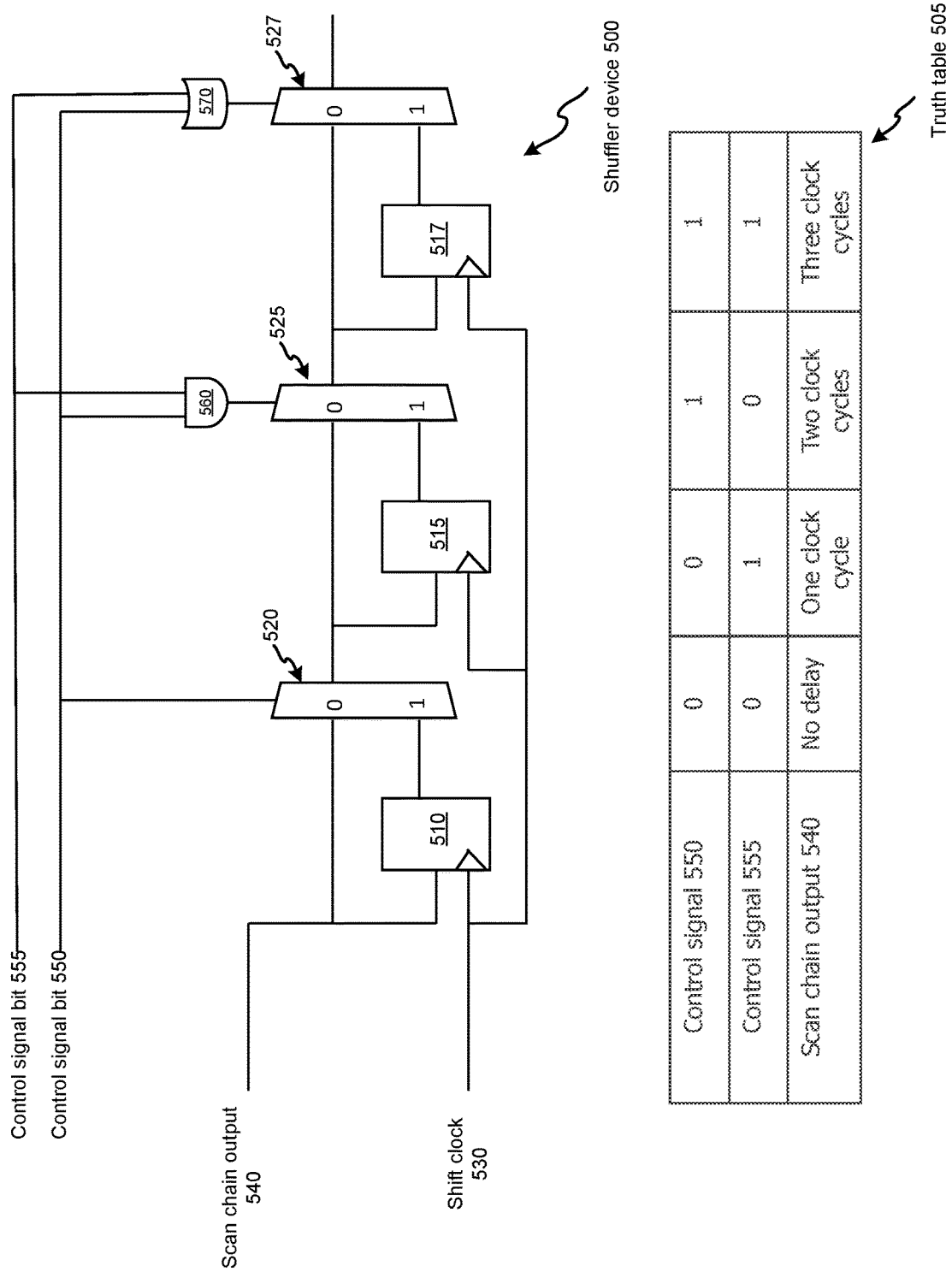
FIG. 5 illustrates an example of a shuffler device capable of delaying multiple clock cycles according to various embodiments of the disclosed technology.

FIG. 5 illustrates another example of a shuffler device 500 that can be used to construct the shuffler circuitry 220 shown in FIG. 2 according to various embodiments of the disclosed technology. The shuffler device 500 comprises three flip-flops 510, 515 and 517, three multiplexers 520, 525 and 527, an AND gate 560, and an OR gate 570. The flip-flops 510, 515 and 517 are clocked by a shift clock 530 which also clocks, during a shift operation, the scan chains which are not shown here. Two control signal bits 550 and 555 determine how many clock cycles a scan chain output signal 540 is delayed. The operation of the shuffler device 500 is summarized in a truth table 505. If both of the control signal bits 550 and 555 are "1", the scan chain output signal 540 will pass through the three flip-flops 510, 515 and 517 before the multiplexers 520, 525 and 527, respectively, leading to a delay of three clock cycles. If the control signal bit 550 is "0" and the control signal bit 555 is "1", the scan chain output signal 540 will pass through only the flip-flop 527, leading to a delay of one clock cycle. If the control signal bit 550 is "1" and the control signal bit 555 is "0", the scan chain output signal 540 will pass through both of the flip-flops 520 and 527, but not through the flip-flop 525, leading to a delay of two clock cycles. By varying the control signal bits 550 and 555, the scan chain output signal 540 can be delayed by 0, 1, 2 or 3 shift clock cycles.

In a compactor, a test response bit captured by a scan cell on one scan chain is combined with test response bits captured by scan cells on some other scan chains. With scan chains using different control bits for different test pattern, test response bits captured by the scan cell can be combined with test response bits captured by different scan cells on those some other scan chains for different test pattern. This can lead to a reduction of fault equivalency caused by the compaction. It is worth mentioning that FIGS. 4 and 5 just show two examples of building blocks (shuffler devices) of the shuffler circuitry and that the shuffler circuitry can have different architectures including different shuffler devices according to various embodiments of the disclosed technology.

Figure 6A:
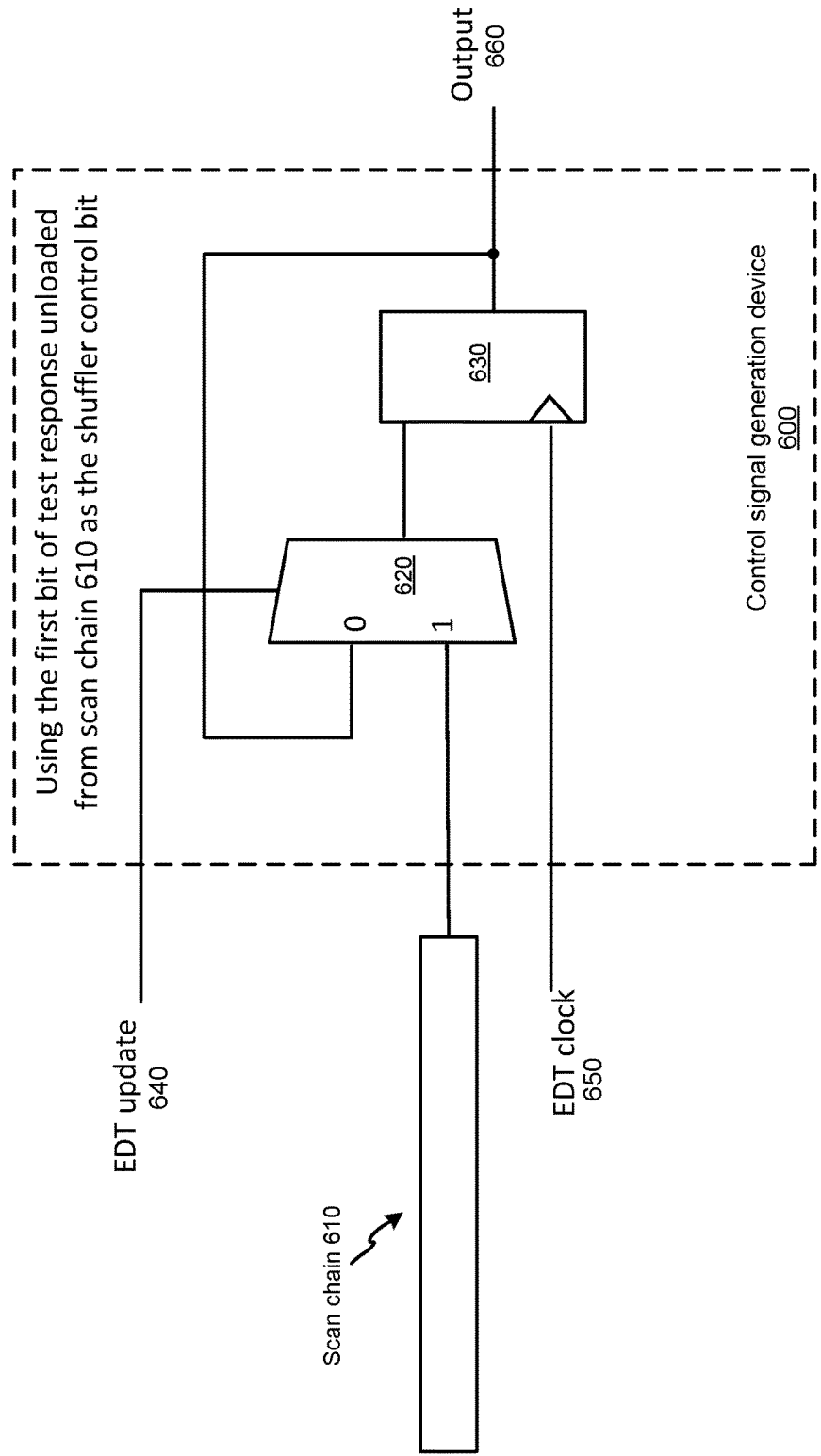
FIG. 6A illustrates an example of a control signal generation device according to some embodiments of the disclosed technology.

FIG. 6A illustrates an example of a control signal generation device 600 according to some embodiments of the disclosed technology. The control signal generation device 600 is configured to use the first bit of a test response unloaded from the scan chain 610 as a control bit for shuffling the test response. The control signal generation device 600 comprises a multiplexer 620 and a flip-flop 630. One input ("1" input) of the multiplexer 620 is coupled to the output of the scan chain 610, and the other input ("0" input) is coupled to the output of the flip-flop 630. The flip-flop 630 receives an input signal from the output of the multiplexer 620 and is clocked by an EDT clock 650. Here, an EDT decompressor is used to generate test patterns from compressed test patterns. The EDT clock 650, used by the EDT decompressor, is similar to a shift clock used by the scan chain 610. However, the EDT clock 650 may still operate when the scan chain 610 stops shifting. An EDT update signal 640 selects from which input of the multiplexer 620 the output signal is derived. When the EDT update signal 640 is enabled ("1"), the flip-flop 630 is updated with a bit outputted from the scan chain 610. When the EDT update signal 640 is disabled ("0"), the flip-flop 630 keeps the stored bit. The EDT update signal 640 is typically used to reset, when enabled, the EDT decompressor before the EDT decompressor accepts the next compressed test pattern. Accordingly, the control signal generation device 600 will be updated with the first bit of a test response unloaded from the scan chain 610. This bit will remain at the output of the control signal generation device 600 to serve as a control bit for shuffling while the test response is being unloaded.

Figure 6B:
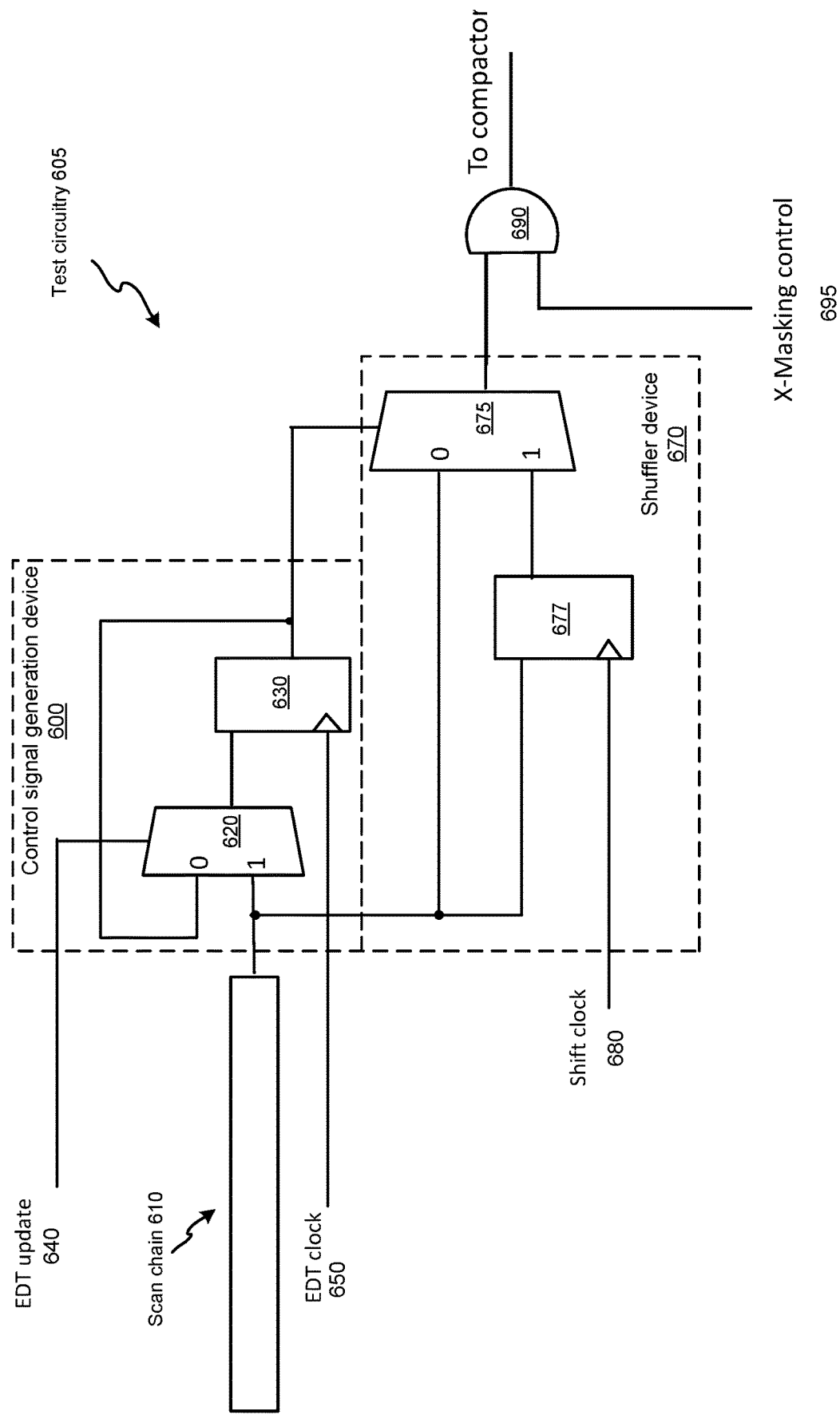
FIG. 6B illustrates an example of test circuitry comprising control signal generation device, shuffler circuitry and X-masking circuitry according to some embodiments of the disclosed technology.

FIG. 6B illustrates an example of test circuitry 605 combining the control signal generation device 600 with a shuffler device 670 and an X-masking device 690 according to some embodiments of the disclosed technology. Like the shuffler device 400 shown in FIG. 4, the shuffler device 670 comprises a flip-flop 677 and a multiplexer 675. The output of the scan chain 610 is coupled to both the "0" input of the multiplexer 675 and the input of the flip-flop 677. The output of the flip-flop 677 is coupled to the "1" input of the multiplexer 675. The flip-flop 677 is clocked by a shift clock 680 which also clocks the scan chain 610 during a shift operation. The select input of the multiplexer 675 is coupled to the output of the control signal generation device 600. The output of the shuffler device 670 is coupled to the input of the X-masking device 690 which is an AND gate 690 in this example. The other input of the AND gate 690 receives an X-masking control signal 695. When the X-masking control signal 695 is "0", the output of the scan chain 610 is blocked or masked. When the X-masking control signal 680 is "1", the output of the scan chain 610 can reach a compactor.

While shown to comprise one scan chain, the scan chain 610, the test circuitry 605 can comprise many more scan chains. The other scan chains can use control signal generation devices, shuffler devices and X-masking devices similar to those shown in FIG. 6B. The first bits of test responses to a set of test patterns unloaded from the scan chains typically vary with test pattern. Accordingly, for a particular scan chain, the control bit will be "0" for some test patterns and "1" for the other test patterns. Moreover, for a particular test pattern, the first bit will be "1" for some of the scan chains and "1" for the rest of the scan chains. As a result, the compactor combines test response bits captured by a particular scan cell with bits captured by different scan cells for different test patterns, reducing the fault equivalency for diagnosis.

It should be appreciated by a person skill in the art that while the control signal generation device 600 uses the first bit of a test response outputted by the scan chain 610 to generate a bit of the control signal, any other bit of the test response at a different clock cycle can also be used. The selection input of the multiplexer 620 needs to be changed accordingly to select a bit outputted from the scan chain 610 at a different clock cycle.

Figure 7:
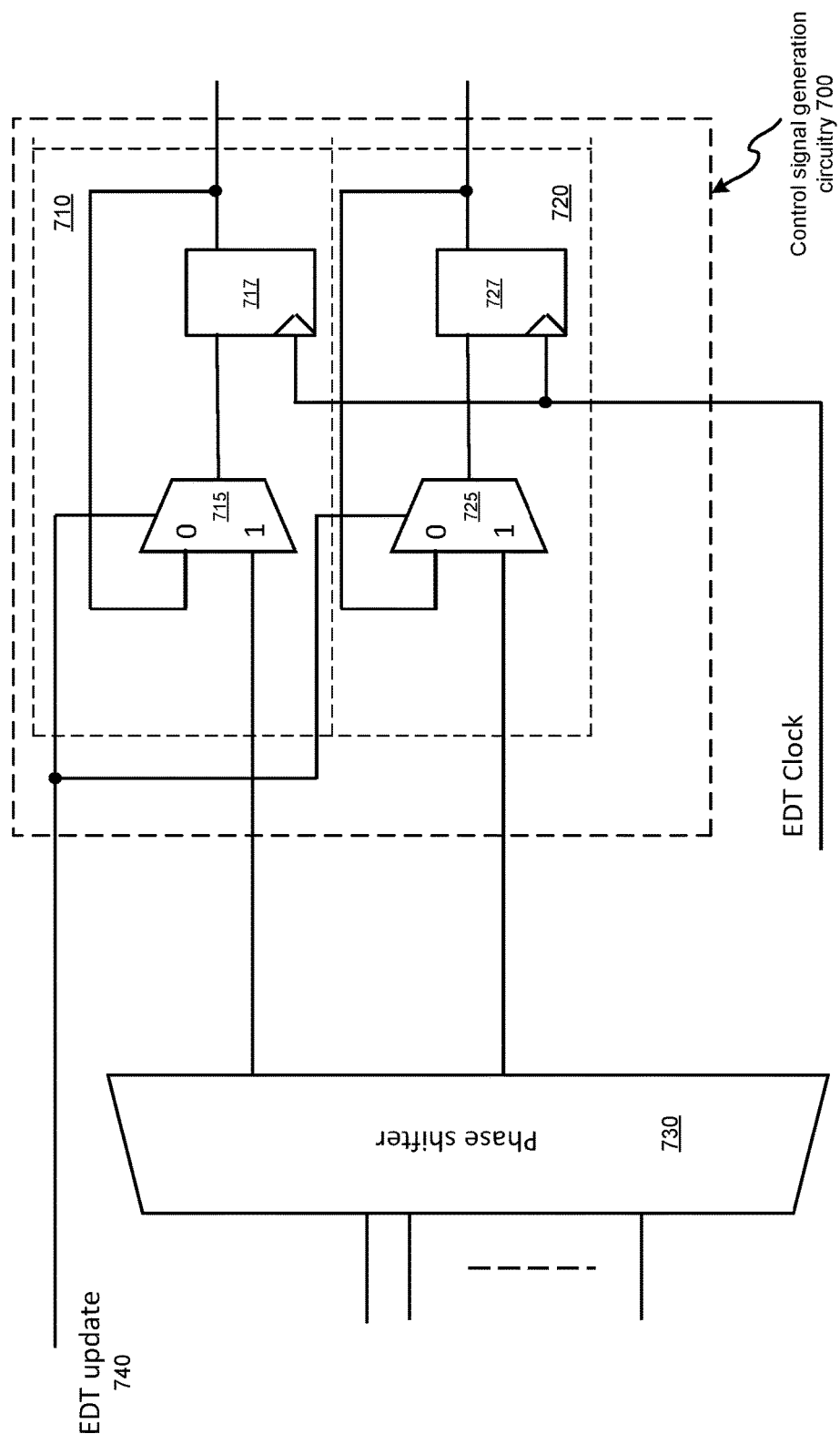
FIG. 7 illustrates an example of control signal generation circuitry configured to generate a shuffling control signal based on multiple outputs of a test pattern decompressor according to various embodiments of the disclosed technology.

FIG. 7 illustrates an example of control signal generation circuitry 700 configured to generate a shuffling control signal based on multiple outputs of a test pattern decompressor according to various embodiments of the disclosed technology. The control signal generation circuitry 700 is shown to comprise two identical control signal generation devices 710 and 720, but can include many more such devices. The control signal generation devices 710 and 720 are similar to the control signal generation device 600 shown in FIG. 6A: Each of the control signal generation devices 710 and 720 comprises a multiplexer (715, 725) and a flip-flop (717, 727). The difference is that the control signal generation devices 710 and 720 receive inputs not from scan chains but from a phase shifter 730. The phase shifter 730 is a part of an EDT decompressor which drives scan chains as well. When an EDT update signal 740 is enabled, the bits stored in the control signal generation devices 710 and 720 are updated with the last bits outputted by the phase shifter 730, serving as the shuffling control signal bits for the test response to the test pattern just loaded into the scan chains. The shuffling control signal bits generated in this way can be set before the test, and thus this control signal generation scheme is sometimes referred to as deterministic control signal generation.

It should be appreciated by a person skill in the art that while the control signal generation circuitry 700 uses the last bits outputted by the phase shifter 730 to generate bits of the control signal, any other bits at different clock cycle can also be used. The selection inputs of the multiplexers 715 and 725 need to be changed accordingly to select bits outputted from the phase shifter 730 at a different clock cycle.

Figure 8:
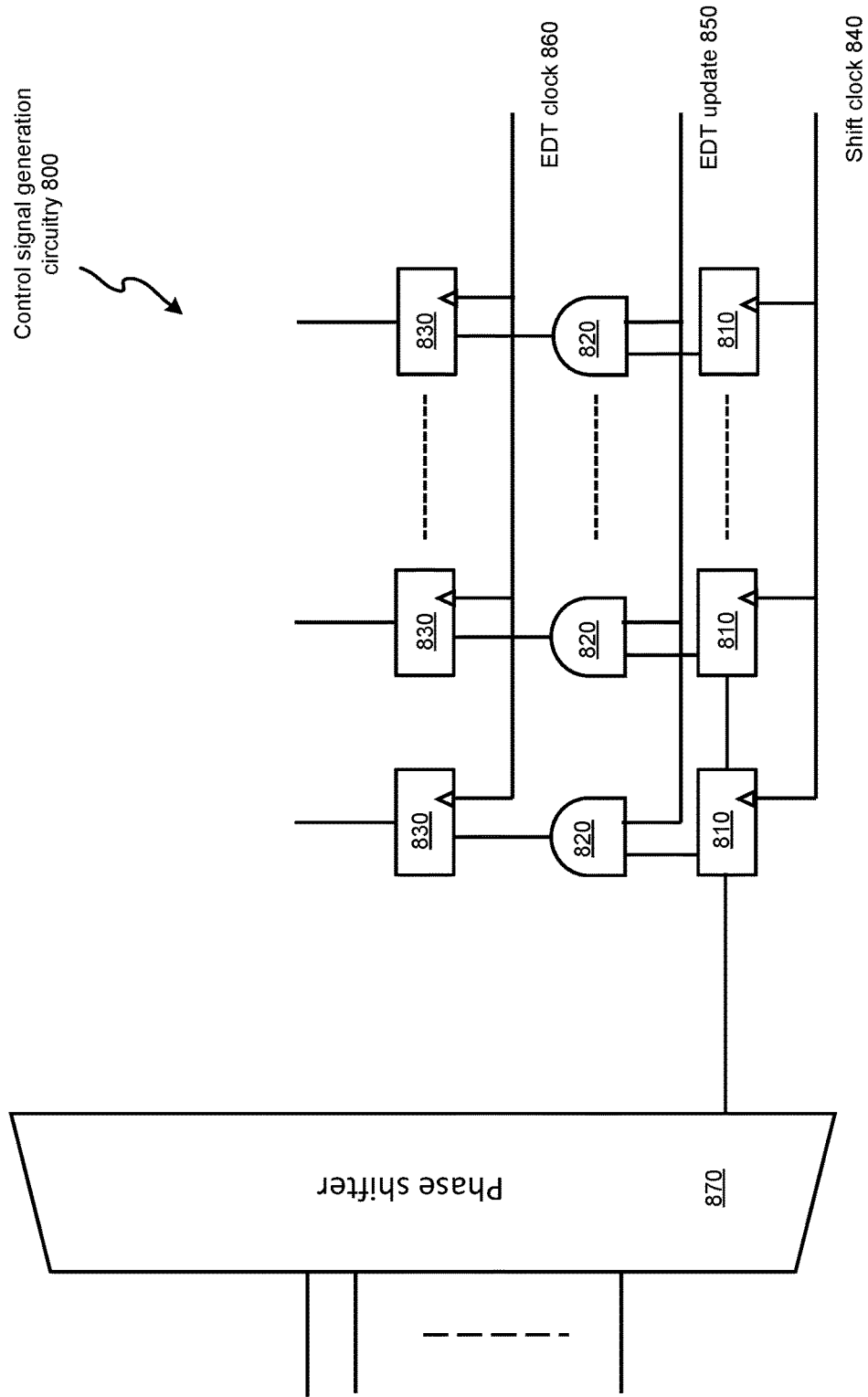
FIG. 8 illustrates an example of control signal generation circuitry configured to generate a shuffling control signal based on a single output of a test pattern decompressor according to various embodiments of the disclosed technology.

FIG. 8 illustrates an example of control signal generation circuitry 800 configured to generate a shuffling control signal based on a single output of a test pattern decompressor according to various embodiments of the disclosed technology. The control signal generation circuitry 800 comprises flip-flops 810 forming a scan chain. The serial input of the scan chain 810 is coupled to one output channel of a phase shifter 870 and is clocked by a shift clock signal 840. The shift clock signal 840 also clocks other regular scan chains during a shift operation. The control signal generation circuitry 800 also comprises AND gates 820 and flip-flops 830. Each of the AND gates 820 is paired with one of the flip-flop 830 with the inputs of the flip-flop 830 coupled to the output of the AND gates 820. One group of the inputs of AND gates 820 are coupled to the parallel outputs of the scan chain 810, and the other group of the inputs of AND gates 820 receive an EDT update signal 850. The flip-flops 830 are clocked by an EDT clock signal 860. The EDT update signal 850 and the EDT clock signal 860 are similar to the EDT update signal 640 and the EDT clock signal 650 in FIG. 6. Control bits can be shifted into the scan chain 810 and then can be uploaded into the flip-flops 830 when the EDT update signal 850 is enabled. Alternatively, the scan chain 810 may receive bits directly from one input channel without through the test pattern decompressor that includes the phase shifter 870.

The control signal bits generated by control signal generation circuitry like the one based on the control signal generation device 600 in FIG. 6A, the control signal generation circuitry 700 in FIG. 7, or the control signal generation circuitry 800 in FIG. 8 can be used directly by the shuffler circuitry 220 in FIG. 2. If the shuffler circuitry 220 needs more control signal bits than the number of control signal generation devices in the control signal generation circuitry, control signal multiplexing circuitry may be inserted between the control signal generation circuitry and the shuffler circuitry. FIG. 9A illustrates an example of control signal multiplexing circuitry 900 according to various embodiments of the disclosed technology. The control signal multiplexing circuitry 900 simply couples one of input channels to two output channels. As such, one control bit generated by the control signal generation circuitry can be used to control two shuffler devices in the circuitry. It should be noted that the control signal multiplexing circuitry can couple one of input channels to more than two output channels.

FIG. 9B illustrates another example of control signal multiplexing circuitry 910 according to various embodiments of the disclosed technology. The control signal multiplexing circuitry 910 can be constructed using XOR gates like the phase shifter used in a test pattern decompressor. The input bits from the control signal generation circuitry are combined and expanded into more output bits.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A circuit, comprising:
scan chains comprising scan cells, the scan chains configured to shift in test patterns, apply the test patterns to the circuit, capture test responses of the circuit, and shift out the test responses;
a decompressor configured to decompress compressed test patterns into the test patterns;
a test response compactor configured to compact the test responses; and
shuffler circuitry inserted between outputs of the scan chains and inputs of the test response compactor, the shuffler circuitry comprising state elements configured to delay output signals from some of the scan chains for one or more clock cycles based on a control signal, the control signal varying with the test patterns.

2. The circuit recited in claim 1, further comprising:
control signal generation circuitry configured to generate the control signal or a source signal which can be multiplexed to form the control signal.

3. The circuit recited in claim 2, further comprising:
control signal multiplexing circuitry configured to multiplex the source signal to form the control signal.

4. The circuit recited in claim 2, wherein the control signal or the source signal comprises bits outputted from some or all of the scan chains at a particular clock cycle.

5. The circuit recited in claim 2, wherein the control signal or the source signal comprises bits outputted from some or all of output channels of the decompressor at a particular clock cycle.

6. The circuit recited in claim 2, wherein the control signal or the source signal comprises bits outputted from one of output channels of the decompressor or an input port of the circuit for a plurality of clock cycles.

7. The circuit recited in claim 1, further comprising:
masking circuitry inserted either between the outputs of the scan chains and inputs of the shuffler circuitry or outputs of the shuffler circuitry and the inputs of the test response compactor, the masking circuitry configured to block output signals from one or more of the scan chains from reaching the inputs of the compactor based on a masking control signal.

8. The circuit recited in claim 1, wherein the control signal is derived from last bits of a test response outputted from some or all of the scan chains.

9. The circuit recited in claim 1, wherein the test response compactor comprises an XOR gate network or an inverter network.

10. The circuit recited in claim 1, wherein the shuffler circuitry comprises a plurality of shuffler devices, each of the plurality of shuffler devices being associated with one of the scan chains, comprising one or more pairs of a state element and a multiplexer, and being controlled by one or more bits of the control signal.

11. One or more non-transitory computer-readable media storing computer-executable instructions for causing a computer to perform a method, the method comprising:
creating a circuit in a circuit design for testing a chip fabricated according to the circuit design, the circuit comprising:
scan chains comprising scan cells, the scan chains configured to shift in test patterns, apply the test patterns to the circuit, capture test responses of the circuit, and shift out the test responses;
a decompressor configured to decompress compressed test patterns into the test patterns;
a test response compactor configured to compact the test responses; and
shuffler circuitry inserted between outputs of the scan chains and inputs of the test response compactor, the shuffler circuitry comprising state elements configured to delay output signals from some of the scan chains for one or more clock cycles based on a control signal, the control signal varying with the test patterns.

12. The one or more non-transitory computer-readable media recited in claim 11, wherein the circuit further comprises:
control signal generation circuitry configured to generate the control signal or a source signal which can be multiplexed to form the control signal.

13. The one or more non-transitory computer-readable media recited in claim 12, wherein the circuit further comprises:
control signal multiplexing circuitry configured to multiplex the source signal to form the control signal.

14. The one or more non-transitory computer-readable media recited in claim 12, wherein the control signal or the source signal comprises bits outputted from some or all of the scan chains at a particular clock cycle.

15. The one or more non-transitory computer-readable media recited in claim 12, wherein the control signal or the source signal comprises bits outputted from some or all of output channels of the decompressor at a particular clock cycle.

16. The one or more non-transitory computer-readable media recited in claim 12, wherein the control signal or the source signal comprises bits outputted from one of output channels of the decompressor or an input port of the circuit for a plurality of clock cycles.

17. The one or more non-transitory computer-readable media recited in claim 11, wherein the circuit further comprises:
masking circuitry inserted either between the outputs of the scan chains and inputs of the shuffler circuitry or outputs of the shuffler circuitry and the inputs of the test response compactor, the masking circuitry configured to block output signals from one or more of the scan chains from reaching the inputs of the compactor based on a masking control signal.

18. The one or more non-transitory computer-readable media recited in claim 11, wherein the control signal is derived from last bits of a test response outputted from some or all of the scan chains.

19. The one or more non-transitory computer-readable media recited in claim 11, wherein the test response compactor comprises an XOR gate network or an inverter network.

20. The one or more non-transitory computer-readable media recited in claim 11, wherein the shuffler circuitry comprises a plurality of shuffler devices, each of the plurality of shuffler devices being associated with one of the scan chains, comprising one or more pairs of a state element and a multiplexer, and being controlled by one or more bits of the control signal.

* * * * *